United States Patent
Cali et al.

(10) Patent No.: US 9,900,012 B2
(45) Date of Patent: Feb. 20, 2018

(54) MULTI-MODULUS DIVIDER WITH POWER-OF-2 BOUNDARY CONDITION SUPPORT

(71) Applicant: BAE Systems Information and Electronic Systems Integration Inc., Nashua, NH (US)

(72) Inventors: Joseph D. Cali, Nashua, NH (US); Curtis M. Grens, Manchester, NH (US); Lawrence J. Kushner, Andover, MA (US); Steven E. Turner, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 173 days.

(21) Appl. No.: 15/099,753

(22) Filed: Apr. 15, 2016

(65) Prior Publication Data
US 2016/0308536 A1 Oct. 20, 2016

Related U.S. Application Data

(60) Provisional application No. 62/148,251, filed on Apr. 16, 2015.

(51) Int. Cl.
*H03K 21/00* (2006.01)
*H03K 23/00* (2006.01)
(Continued)

(52) U.S. Cl.
CPC ......... *H03K 21/026* (2013.01); *H03K 21/38* (2013.01); *H03L 7/1974* (2013.01); *G06F 1/08* (2013.01);
(Continued)

(58) Field of Classification Search
None
See application file for complete search history.

(56) References Cited

U.S. PATENT DOCUMENTS

| | | | | |
|---|---|---|---|---|
| 5,060,243 A | * | 10/1991 | Eckert | H03K 21/12 377/111 |
| 5,454,018 A | * | 9/1995 | Hopkins | H03K 21/38 377/107 |
| 7,109,762 B2 | | 9/2006 | Neurauter et al. | |
| 7,298,810 B2 | * | 11/2007 | Ke | H03K 23/667 377/47 |
| 7,417,474 B1 | * | 8/2008 | Jamal | G06F 7/68 327/117 |

(Continued)

OTHER PUBLICATIONS

Barrett, C., Editor, "Fractional/Integer-N PLL Basics," Texas Instruments, Technical Brief—SWRA029, Wireless Communication Business Unit, Aug. 1999. pp. 1-55.

(Continued)

*Primary Examiner* — Tuan T Lam
(74) *Attorney, Agent, or Firm* — Finch & Maloney PLLC

(57) ABSTRACT

Frequency divider techniques are disclosed which can be used to address two problems: when an incorrect division occurs if the modulus control changes before the divide cycle is complete, and when an incorrect division occurs due to a boundary crossing (e.g., power-of-2 boundary crossing in a fractional-N PLL application). In one embodiment, a frequency divider is provided comprising a plurality of flip-flops operatively coupled to carry out division of an input frequency, and configured to generate a modulus output and receive a divided clock signal of a previous cell. An additional flip-flop is selectively clocked off one of the modulus output or the divided clock of the previous stage, depending at least in part on a Skip control signal applied to a data input of the additional flip-flop, and is further configured to selectively reset the plurality of flip-flops to a state that will result in a correct divide ratio.

20 Claims, 3 Drawing Sheets

(51) Int. Cl.
  *H03K 21/02* (2006.01)
  *H03K 21/38* (2006.01)
  *H03L 7/197* (2006.01)
  *G06F 7/68* (2006.01)
  *H03K 23/40* (2006.01)
  *G06F 1/08* (2006.01)
  *H03K 23/64* (2006.01)
  *H03K 21/40* (2006.01)
  *H03K 23/58* (2006.01)
  *H03K 23/68* (2006.01)
  *H03K 21/10* (2006.01)

(52) U.S. Cl.
  CPC ............... *G06F 7/68* (2013.01); *H03K 21/00* (2013.01); *H03K 21/10* (2013.01); *H03K 21/40* (2013.01); *H03K 23/00* (2013.01); *H03K 23/40* (2013.01); *H03K 23/58* (2013.01); *H03K 23/64* (2013.01); *H03K 23/68* (2013.01)

(56) References Cited

U.S. PATENT DOCUMENTS

| | | | |
|---|---|---|---|
| 8,552,770 B2 | 10/2013 | Cavin | |
| 9,118,333 B1* | 8/2015 | Mika | H03K 23/70 |
| 9,565,368 B2* | 2/2017 | Nilsson | G06T 5/50 |
| 9,748,961 B2* | 8/2017 | Cali | H03L 7/1974 |
| 2014/0003569 A1* | 1/2014 | Martin | H03K 21/08 |
| | | | 377/48 |
| 2014/0312936 A1 | 10/2014 | Abdel-Haleem et al. | |
| 2017/0041005 A1* | 2/2017 | Pandita | H03L 7/18 |

OTHER PUBLICATIONS

Vaucher, et al., A Family of Low-Power Truly Modular Programmable Dividers in Standard 0.35—μm CMOS Technology. IEEE Journal of Solid-State Circuits, vol. 35, No. 7, Jul. 2000. pp. 1039-1045.

* cited by examiner

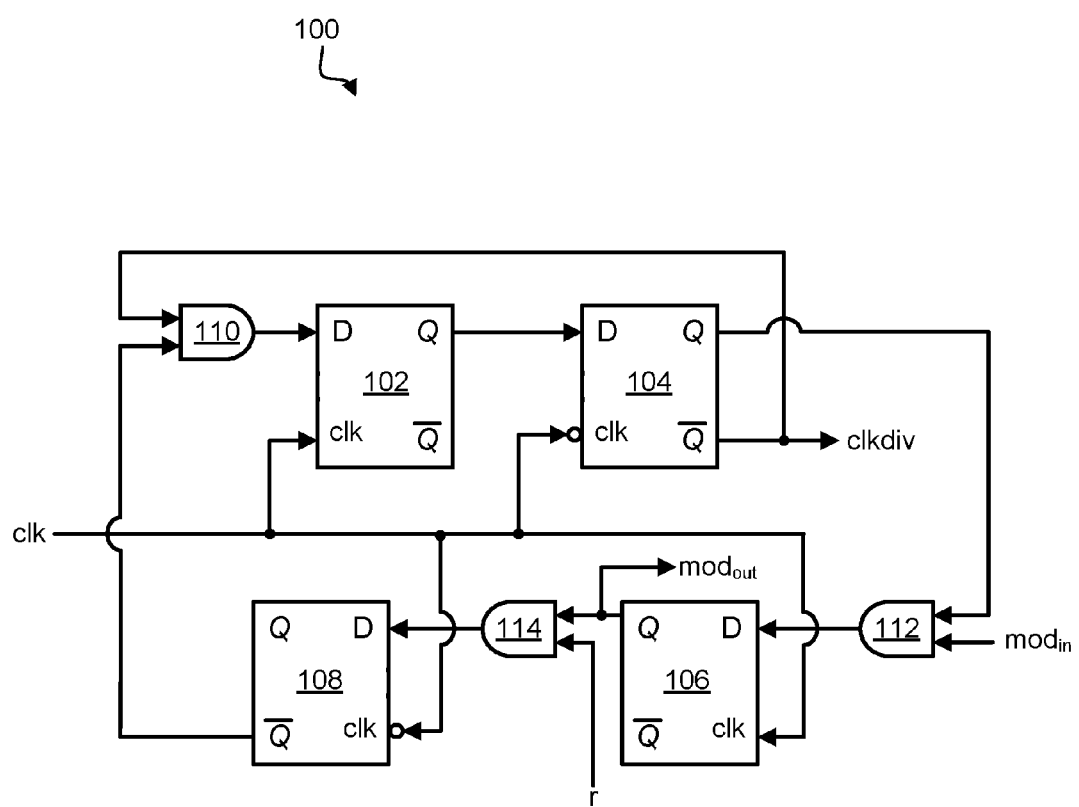
Fig. 1
(conventional)

MULTI-MODULUS DIVIDER WITH POWER-OF-2 BOUNDARY CONDITION SUPPORT

RELATED APPLICATION

This application claims the benefit of U.S. Provisional Application No. 62/148,251 filed on Apr. 16, 2015, which is herein incorporated by reference in its entirety.

STATEMENT OF GOVERNMENT INTEREST

The invention was made with United States Government support under Contract No. HR0011-12-C-0083 awarded by Defense Advanced Research Projects Agency (DARPA). The United States Government has certain rights in this invention.

FIELD OF THE DISCLOSURE

This disclosure relates generally to frequency dividers, and in particular to circuitry for dividing a signal with synchronous extension across octave (power-of-two) boundaries.

BACKGROUND

A frequency divider is a circuit that receives an input signal having a first frequency ($F_{in}$) and generates an output signal having a second frequency ($F_{out}$). The relationship of $F_{in}$ to $F_{out}$ can be expressed as $F_{out}=F_{in}/N$, where N is an integer. Frequency dividers can be implemented in analog or digital domains and are used in many applications. For example, phase-locked loop (PLL) frequency synthesizers use frequency dividers to convert the output frequency of a voltage-controlled oscillator (or a digitally-controlled oscillator, as the case may be) down to a reference frequency. One example type of frequency divider is called a multi-modulus divider (MMD), which includes an asynchronous cascade of divide-by-2-or-3 (DIV23) cells or stages. A conventional MMD consists of N stages and performs a division between 2N and 2(N+1)−1.

FIG. 1 illustrates a schematic drawing showing a conventional DIV23 circuit 100. Frequency dividers are commonly fabricated with D-type flip-flops (DFFs). As is generally known, a D-type flip-flop is constructed from a gated SR flip-flop with an inverter added between the S (set) and the R (reset) inputs to allow for a single D (data) input. This data input D can be used as the set signal, and the internal inverter is used to generate the complementary reset input. As can be seen in FIG. 1, circuit 100 includes three two-input AND gates (110, 112, and 114) and four DFFs (102, 104, 106, and 108). The inputs to circuit 100 include the input clock signal (clk) and two control signals ($mod_{in}$ and r). The divisor value (N) of circuit 100 can be set by the two control signals. The outputs of circuit 100 include the divided clock signal (clkdiv) and $mod_{out}$. As will be appreciated, the divided clock signal clkdiv will have a frequency that is equal to the frequency of the input clock signal clk divided by either two or three, depending on the mode of operation. The $mod_{out}$ node of circuit 100 may be coupled to the $mod_{in}$ node of a preceding cell within a larger divider circuit that includes a series of DIV23 circuits 100. In other example configurations, depending on the application, the DIV23 circuit 100 may be configured with a master-slave configuration, where a master clock signal is applied to two master latches (DFF 102 and 106), and slave clock signal is applied to two slave latches (DFF 104 and 108). In any case, signal $mod_{in}$ or signal r or both can be set to logical 0 (LOW) for the divide-by-2 mode (i.e., $F_{out}=F_{in}/2$). For instance, if control signal $mod_{in}$ is LOW, then the output of AND gate 112 will be LOW which in turn will cause the signal passing through DFF 106, AND gate 114, and into port D of DFF 108 to be LOW. In a similar manner, if control signal r is LOW, then the output signal of AND gate 114 will be LOW which in turn will cause the signal passing into port D of DFF 108 to be LOW. In either case, the signal output from port $\overline{Q}$ of DFF 108 will be a logical 1 (HI). As can further be seen, port $\overline{Q}$ of DFF 108 connects to one of the inputs of AND gate 110. Thus, if $\overline{Q}$ of DFF 108 is HI, then circuit 100 will function as though DFFs 106 and 108 are not part of circuit 100, and as if the $\overline{Q}$ of DFF 104 were directly connected to the D port of DFF 102. On the other hand, if the control signals $mod_{in}$ and r are both set to HI, thereby setting circuit 100 to its divide-by-3 mode, then DFFs 106 and 108 are active parts of circuit 100. The truth table summarizing the control logic for circuit 100 is provided in Table 1.

TABLE 1

Truth Table for DIV23 Circuit 100

| $mod_{in}$ | r | Divider Mode |
|---|---|---|
| 0 | 0 | 2 |
| 1 | 0 | 2 |
| 0 | 1 | 2 |
| 1 | 1 | 3 |

BRIEF DESCRIPTION OF THE DRAWINGS

FIG. 1 illustrates a schematic drawing showing a conventional divide-by-2-or-3 circuit.

DETAILED DESCRIPTION

Figure 2:
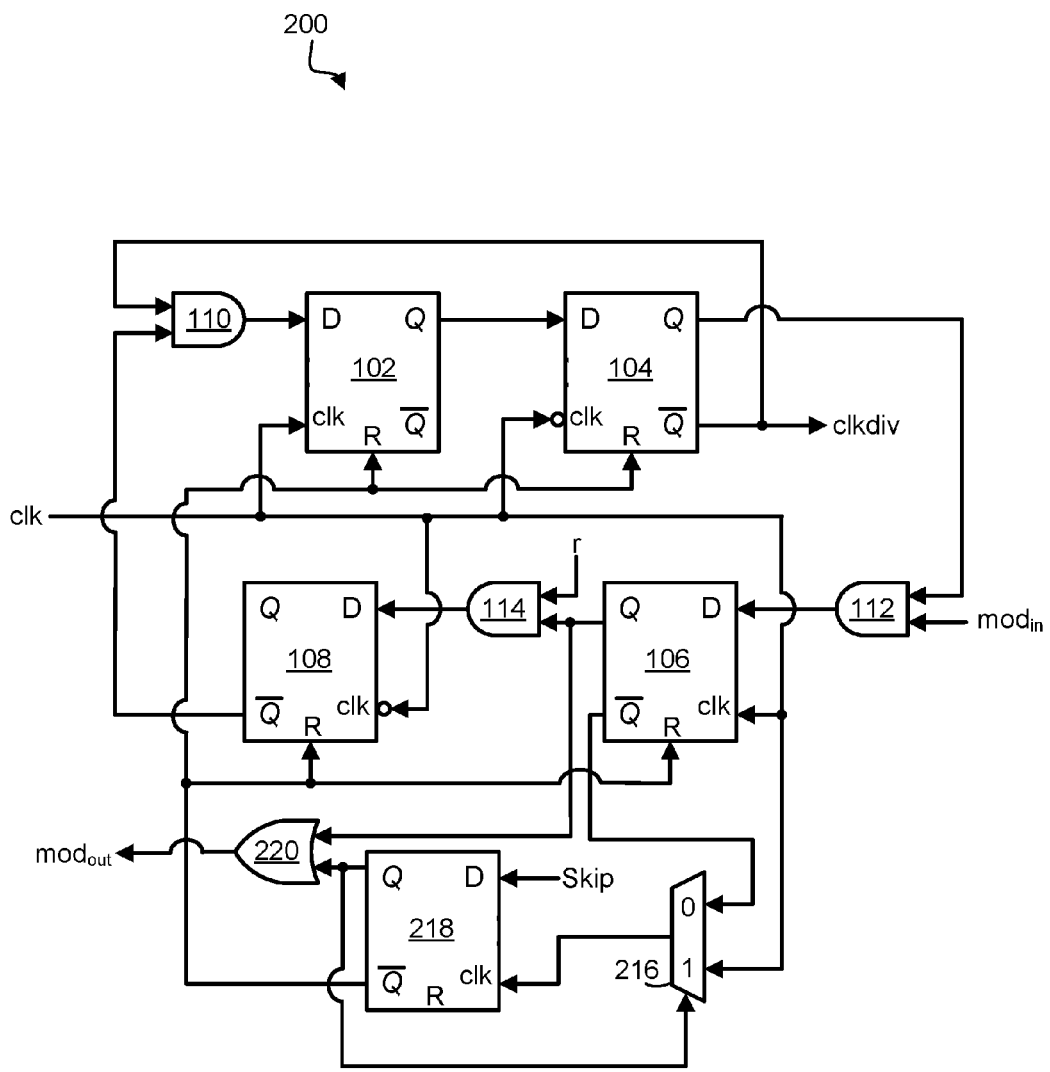
FIG. 2 is a schematic drawing showing an example divide-by-2-or-3 cell configured in accordance with an embodiment of the present disclosure.

Techniques are disclosed for enabling high order delta-sigma modulation in a multi-modulus divider (MMD) in electronic systems and applications. The techniques can be used, for example, to address two problems: when an incorrect division occurs if the modulus control changes before the divide cycle is complete, and when an incorrect division occurs from leaving the boundary divide-by-X cell and returning to it in an unknown state. To this end, the techniques are particularly well-suited to circuits that require a power-of-2 boundary crossing, such as those that have over an octave of tuning range in a fractional-N phase lock loop (PLL) application. For instance, the desired tuning range may happen to cross a power-of-2 boundary with a given reference frequency. Any number of such PLL applications will be appreciated in light of this disclosure, as will other applications that potentially call for fractional frequency division over a large frequency range.

General Overview

In some applications, it may be necessary for a frequency divider to provide over an octave of division range, such as in applications supporting multiple reference frequencies or supporting a very wide PLL tuning range. In such cases, for example, a given DIV23 stage of an MMD can be deactivated by logically OR-ing the modulus output of that stage with a 1, such that the given DIV23 stage no longer impacts the preceding DIV23 stages. Such an MMD configuration allows the MMD to cross a power-of-2 boundary, and is called an Extended MMD (EMMD). When crossing a power-of-2 boundary, the EMMD potentially divides with an incorrect number. In the integer-N PLL cases, this does not matter, because the EMMD resumes dividing correctly on the next division cycle. However, in a fractional-N delta-sigma modulation PLL, the divider can be jumping over a power-of-2 boundary at every divide cycle. This error prevents the PLL from locking. A need, therefore, exists for a frequency dividing circuit configured to handle such cases.

Thus, techniques are provided herein that effectively shut down the clock at the power-of-2 boundary, preventing the clock signal from propagating through the entire EMMD. As will be appreciated in light of this disclosure, the techniques can be implemented to address a number of problems. One problem, for instance, is related to the fact that an incorrect division occurs if the modulus control changes before the divide cycle is complete. Thus, according to an embodiment, a D flip-flop divide-by-two is added to the DIV23 cell that is clocked off the modulus output of that same cell (when active), or the divided clock of the previous stage. This effectively allows the circuit to determine when a division has completed. Another problem is related to the fact that an incorrect division occurs from leaving the boundary DIV23 cell and returning to it in an unknown state. Thus, according to an embodiment, the added D flip-flop is utilized to reset the DIV23 cell to a state that will result in a correct divide ratio. For instance, using an all zero's divide ratio provides the correct result according to some such embodiments of the present disclosure. The techniques can be applied to other divider cells, such as DIV23 or divide-by-1-or-2-or-3 (DIV123).

Example Divide-by-2-or-3 Cell

FIG. 2 is a schematic drawing showing an example divide-by-2-or-3 (DIV23) cell configured in accordance with an embodiment of the present disclosure. As can be seen, circuit 200 is similar to the circuit 100 of FIG. 1, in that it includes three two-input AND gates (110, 112, and 114) and the upper four DFFs (102, 104, 106, and 108). However, the circuit 200 further includes a fifth DFF 218 along with a two-input multiplexer 216 and an OR-gate 220. The inputs to circuit 200 include the input clock signal (clk) and three control signals ($mod_{in}$, r, and Skip). The divisor value (N) of circuit 200 can be set by the three control signals. The outputs of circuit 200 include the divided clock signal (clkdiv) and $mod_{out}$. As will be appreciated, the divided clock signal clkdiv will have a frequency that is equal to the frequency of the input clock signal clk divided by either two or three, depending on the mode of operation. The $mod_{out}$ node of circuit 200 may be coupled to the $mod_{in}$ node of a preceding cell within a larger divider circuit includes a series of DIV23 circuits 200. In other example configurations, and as explained with respect to circuit 100, depending on the application, the DIV23 circuit 200 may be configured with a master-slave configuration, where a master clock signal is applied to two master latches (DFF 102 and 106), and slave clock signal is applied to two slave latches (DFF 104 and 108).

The top four DFFs (102, 104, 106, 108) together operate in a similar fashion as the standard DIV23 circuit 100 shown in FIG. 1, and that discussion is equally applicable here to the relevant extent. However, the DFFs (102, 104, 106, 108) are further configured with an additional input R which resets the state of those four DFFs. The point here is to zero-out the DFF states (102, 104, 106, 108) to ensure that the Skip signal can change states at any time without producing an incorrect divide ratio, which is a problem for the standard DIV23 circuit 100 as previously explained.

To accomplish this, the reset signal for the four upper DFFs (102, 104, 106, 108) is produced by the $\overline{Q}$ output of DFF 218 of circuit 200, which gives the negative edge of the retimed Skip signal. The timing clock of DFF 218 is selected by the two-input mux 216, which is controlled by output Q of DFF 218 (which is the retimed Skip signal). So, when Skip is high, DFF 218 is clocked by the clk input. Otherwise, when Skip is low, DFF 218 is clocked by the $mod_{in}$ signal (input to AND-gate 112) retimed and inverted by DFF 106 (as manifested at the DFF 106 $\overline{Q}$ output). This ensures the proper timing of the reset signal to zero-out the upper four DFFs (102, 104, 106, 108) and maintain a correct divide ratio even when the Skip signal changes states. The truth table summarizing the control logic for DIV23 circuit 200 is provided in Table 2.

TABLE 2

Truth Table for DIV23 Circuit 200

| $mod_{in}$ | r | Skip | Divider Mode | Reset Clock (clk input of DFF 218) |
|---|---|---|---|---|
| 0 | 0 | 0 | 2 | $mod_{in}$ |
| 1 | 0 | 0 | 2 | $mod_{in}$ |
| 0 | 1 | 0 | 2 | $mod_{in}$ |
| 1 | 1 | 0 | 3 | $mod_{in}$ |
| 0 | 0 | 1 | 2 | clk |
| 1 | 0 | 1 | 2 | clk |
| 0 | 1 | 1 | 2 | clk |
| 1 | 1 | 1 | 3 | clk |

So, according to some embodiments of the present disclosure, a D flip-flop divide-by-two (or its equivalent circuit) 218 is added to the DIV23 cell and is clocked or otherwise activated by the same clock as the modulus output of the same cell, or the divided clock of the previous stage, depending on the Skip signal, to determine when a division has completed. An incorrect division may occur from leaving the boundary DIV23 cell and returning to it in an unknown state. In this case, DFF 218 can be used to reset the state of the DIV23 cell (by resetting each of DFFs 102, 104, 106, 108) to a state that will result in a correct divide ratio. Using an all zero's divide ratio provides the correct result, according to some embodiments of the present disclosure.

Advantages of the circuit 200 will be apparent in light of this disclosure. For instance, in a fractional-N frequency synthesizer, the divide ratio is always changing. If the input frequency is near the power-of-2 boundary, and the divider may produce bad values, and the loop will not lock properly. Circuit 200 can be used to prevent or otherwise mitigate bad divider values. With respect to fractional frequency division, in PLL applications, it is possible to achieve a frequency resolution that is a fractional portion of the phase detector frequency. This is accomplished by adding circuitry that enables the value of N to change dynamically during the locked state. If the value of the divider is "switched" between N and N+1 in the correct proportion, an average division ratio can be realized that is N plus some arbitrary fraction. This allows the phase detectors to run at a frequency that is higher than the synthesizer channel spacing.

Divide-by-1-or-2-or-3 Cell

Figure 3:
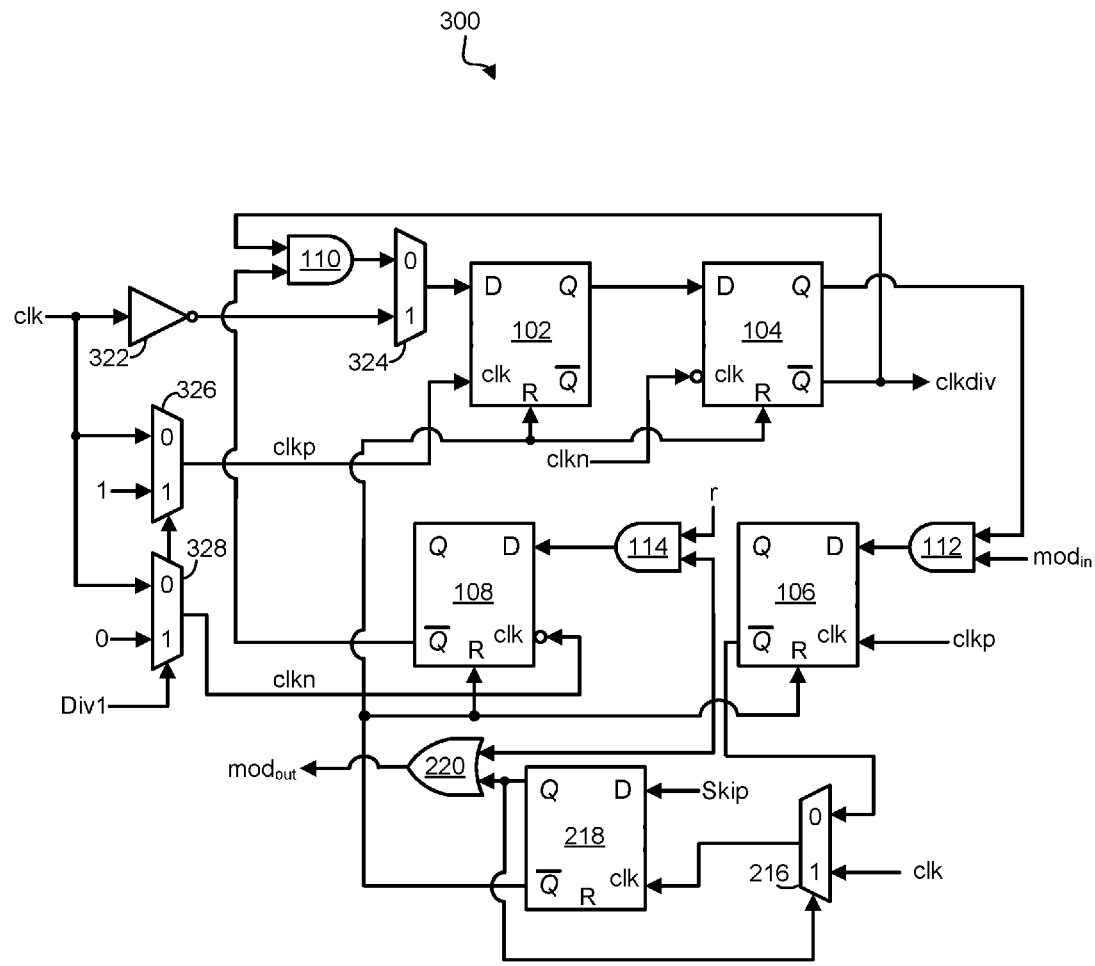
FIG. 3 is a schematic drawing showing an example divide-by-1-or-2-or-3 cell configured in accordance with another embodiment of the present disclosure.

FIG. 3 is a schematic drawing showing an example divide-by-1-or-2-or-3 cell (DIV123) configured in accordance with another embodiment of the present disclosure. This circuit 300 is similar to that the circuit 200 shown in FIG. 2, but is further configured with a divide-by-1 mode, in addition to divide-by-2 and divide-by-3 modes. Thus, like circuit 200, the circuit 300 shown in FIG. 3 can effectively shut down the clock at the power-of-2 boundary thereby preventing the clock signal from propagating through the entire EMMD. In contrast, a conventional DIV23 circuit (FIG. 1) or conventional DIV123 circuit would operate to cause the clock to propagate through the entirety of the EMMD, even to stages not at the power-of-2 boundary. This is increases power consumption and potentially increases the magnitude of the reference spur in the design (due to increased activity of electronics operating at the reference frequency).

As can be seen, the DIV123 circuit 300 includes three two-input AND gates (110, 112, and 114), two master latches (102 and 106), two slave latches (104 and 108), three two-to-one multiplexers (324, 326, and 328), and an inverter (322). This portion of the circuit is conventional. However, circuit 300 is further configured with a reset circuit as previously described with reference to FIG. 2 and which includes a fifth DFF 218 along with a two-input multiplexer 216 and an OR-gate 220. The inputs of circuit 300 include a clock signal (clk) and four control signals ($mod_{in}$, r, Div1, and Skip). The divisor value (N) of circuit 300 can be set by the four control signals. The outputs of circuit 300 include the divided clock signal (clkdiv) and $mod_{out}$. As will be appreciated, the divided clock signal clkdiv will have a frequency that is equal to the frequency of the input clock signal clk divided by one, two, or three, depending on the mode of operation. The $mod_{out}$ node of circuit 300 may be coupled to the $mod_{in}$ node of a preceding cell within a larger divider circuit including a series of DIV23 and/or other DIV123 cells.

The output of mux 326 is signal clkp, which clocks master DFFs 102 and 106. The inputs to mux 326 include the clk signal coupled to the 0 node, a HI signal coupled to the 1 node, and Div1 coupled to the select/control node. The output of mux 328 is signal clkn, which clocks slave DFFs 104 and 108. The inputs to mux 328 include the clk signal coupled to the 0 node, a LOW signal coupled to the 1 node, and Div1 coupled to the select/control node. Thus, if the divide-by-1 mode is selected (Div1 set to HI), then the clkp signal is set HI and the clkn signal is set LOW. Master DFFs 102 and 106 operate as active high latches. Thus, the value at the data input D of master DFFs 102 and 106 passes through to output nodes Q and $\overline{Q}$ when clkp is HI. Slave DFFs 104 and 108 operate as active low latches. Thus, the value at the data input D of slave DFFs 104 and 108 passes through to output nodes Q and $\overline{Q}$ when clkn is LOW.

The $\overline{Q}$ node of slave DFF 104 is connected to one of the inputs of the two-input AND gate 110, and the $\overline{Q}$ node of slave DFF 108 is connected to the other input of AND gate 110. The output of AND gate 110 is coupled to the 0 (LOW) node of mux 324. The 1 (HI) node of mux 324 is coupled to the output of inverter 322, to receive the inverted clk signal. The select/control input of mux 324 is coupled to input signal Div1. The output node of mux 324 is coupled to the data input D of master DFF 102.

TABLE 3

Truth Table for DIV123 Circuit 300

| $mod_{in}$ | r | Div1 | Divider Mode |
|---|---|---|---|
| 0 | 0 | 0 | 2 |
| 1 | 0 | 0 | 2 |

TABLE 3-continued

Truth Table for DIV123 Circuit 300

| $mod_{in}$ | r | Div1 | Divider Mode |
|---|---|---|---|
| 0 | 1 | 0 | 2 |
| 1 | 1 | 0 | 3 |
| X | X | 1 | 1 |

The top four DFFs (102, 104, 106, 108) together operate in a similar fashion as the standard divide-by-1-or-2-or-3 circuit. However, the DFFs (102, 104, 106, 108) are further configured with an additional input R which resets the state of those four DFFs. Thus, in a similar fashion as discussed with reference to FIG. 2, the DFF states (102, 104, 106, 108) can be zeroed-out the to ensure that the Skip signal can change states at any time without producing an incorrect divide ratio, which is a problem for the standard divide-by-1-or-2-or-3 circuit as previously explained.

To accomplish this, the reset signal for the four upper DFFs (102, 104, 106, 108) is produced by the $\overline{Q}$ output of DFF 218 of circuit 300, which gives the negative edge of the retimed Skip signal. The timing clock of DFF 218 is selected by the two-input mux 216, which is controlled by output Q of DFF 218 (which is the retimed Skip signal). So, when Skip is high, DFF 218 is clocked by the clk input. Otherwise, when Skip is low, DFF 218 is clocked by the $mod_{in}$ signal (input to AND-gate 112) retimed and inverted by DFF 106 (as manifested at the DFF 106 $\overline{Q}$ output). This ensures the proper timing of the reset signal to zero-out the upper four DFFs (102, 104, 106, 108) and maintain a correct divide ratio even when the Skip signal changes states. The truth table summarizing the control logic for DIV123 circuit 300 is provided in Table 2.

Numerous variations will be apparent, and the specific logical arrangement shown in FIG. 2 is not intended to limit the present disclosure. Rather, other variations and circuits configured to provide the equivalent logical function can be used. For instance, DFFs 102, 104, 106, 108, and 218 can be implemented by clockable registers or gate-level logic, as well as commercially available flip-flop circuits. To this end, reference to DFF or D-type flip-flop herein is intended to include all hardware variations that achieve the same result as provided herein. Likewise, logic gates such as 110, 112, 114, and 220 can be implemented with transistor arrangements as well as commercially available logic gates, or combinations thereof configured to provide comparable functionality.

Further Example Embodiments

The following examples pertain to further embodiments, from which numerous permutations and configurations will be apparent.

Example 1 is a frequency divider circuit comprising: a plurality of flip-flops operatively coupled to carry out division of an input frequency, the plurality of flip-flops configured to generate a modulus output and to receive a divided clock signal of a previous cell; and an additional flip-flop that is selectively clocked off the modulus output or the divided clock of the previous stage, depending at least in part on a control signal applied to a data input of the additional flip-flop, wherein the additional flip-flop is configured to selectively reset the plurality of flip-flops to a state that will result in a correct divide ratio. Note that the flip-flops may be implemented with, for example, off-the-shelf flip-flop integrated circuit chips (e.g., 54/74FCT374 by Texas Instruments, 74F377 or CD4013BC by Fairchild Semiconductor, or 54F/74F74 by National Semiconductor), or discrete componentry arranged to provide flip-flop functionality, or a custom circuit arranged to provide flip-flop functionality. Any number of suitable configurations can be used, and all such configurations are intended to be covered under the term flip-flop or flip-flop circuit. D-type flip-flops are particularly useful, according to some embodiments, but other types of flip-flops that can be configured to provide comparable functionality (e.g., S-R flip-flop with configured to receive the same input except that the R-input is inverted).

Example 2 includes the subject matter of Example 1, wherein the correct divide ratio is all zeros.

Example 3 includes the subject matter of Example 1 or 2, wherein the control signal applied to the data input of the additional flip-flop has a first state that causes the additional flip-flop to be clocked off the modulus output, and the first state occurs if modulus control changes before a given divide cycle is complete.

Example 4 includes the subject matter of any of the preceding Examples, wherein the additional flip-flop resets the plurality of flip-flops if an incorrect division occurs due to a power-of-2 boundary crossing.

Example 5 includes the subject matter of any of the preceding Examples, wherein the plurality of flip-flops is configured as a divide-by-2-or-3 cell. Note that the frequency divider circuit may include a plurality of such cells and/or other types of cells, depending on the given application.

Example 6 includes the subject matter of any of the preceding Examples, wherein the plurality of flip-flops is configured as a divide-by-1-or-2-or-3 cell. Note that the frequency divider circuit may include a plurality of such cells and/or other types of cells, depending on the given application.

Example 7 includes the subject matter of any of the preceding Examples, wherein the additional flip-flop is part of a reset circuit that further includes a multiplexer, the multiplexer having an output coupled to a clock input of the additional flip-flop, and a select/control coupled to an output of the additional flip-flop, wherein a first input of the multiplexer is coupled to the modulus output and a second input of the multiplexer is coupled to the divided clock signal of a previous cell. The multiplexer may be, for instance, an off-the-shelf multiplexer integrated circuit (e.g., CY74FCT257T by Texas Instruments), or discrete componentry arranged to provide multiplexer functionality, or a custom circuit arranged to provide multiplexer functionality. Any number of configurations can be used.

Example 8 includes the subject matter of Example 7, wherein the reset circuit further includes a two-input OR-gate having its first input coupled to the modulus output and its second output coupled to the output of the additional flip-flop, and the modulus output is represented at an output of the OR-gate.

Example 9 is a frequency divider circuit comprising: a plurality of D-type flip-flops operatively coupled as a divide-by-2-or-3 cell to carry out division of an input frequency, the plurality of D-type flip-flops configured to generate a modulus output and to receive a divided clock signal of a previous cell; and an additional D-type flip-flop that is selectively clocked off the modulus output or the divided clock of the previous stage, depending at least in part on a control signal applied to a data input of the additional D-type flip-flop, wherein the additional D-type flip-flop is configured to selectively reset the plurality of D-type flip-flops to a state that will result in a correct divide ratio.

Example 10 includes the subject matter of Example 9, wherein the correct divide ratio is all zeros.

Example 11 includes the subject matter of Example 9 or 10, wherein the control signal applied to the data input of the additional D-type flip-flop has a first state that causes the additional D-type flip-flop to be clocked off the modulus output, and the first state occurs if modulus control changes before a given divide cycle is complete.

Example 12 includes the subject matter of any of Examples 9 through 11, wherein the additional D-type flip-flop resets the plurality of D-type flip-flops if an incorrect division occurs due to a power-of-2 boundary crossing.

Example 13 includes the subject matter of any of Examples 9 through 12, wherein the additional D-type flip-flop is part of a reset circuit that further includes a two-input multiplexer, the two-input multiplexer having an output coupled to a clock input of the additional D-type flip-flop, and a select/control coupled to an output of the additional D-type flip-flop, wherein a first input of the two-input multiplexer is coupled to the modulus output and the second input of the two-input multiplexer is coupled to the divided clock signal of a previous cell.

Example 14 includes the subject matter of Example 13, wherein the reset circuit further includes a two-input OR-gate having its first input coupled to the modulus output and its second output coupled to the output of the additional D-type flip-flop, and the modulus output is represented at an output of the OR-gate.

Example 15 is a frequency divider circuit comprising: a plurality of D-type flip-flops operatively coupled as a divide-by-1-or-2-or-3 cell to carry out division of an input frequency, the plurality of D-type flip-flops configured to generate a modulus output and to receive a divided clock signal of a previous cell; and an additional D-type flip-flop that is selectively clocked off the modulus output or the divided clock of the previous stage, depending at least in part on a control signal applied to a data input of the additional D-type flip-flop, wherein the additional D-type flip-flop is configured to selectively reset the plurality of D-type flip-flops to a state that will result in a correct divide ratio.

Example 16 includes the subject matter of Example 15, wherein the correct divide ratio is all zeros.

Example 17 includes the subject matter of Example 15 or 16, wherein the control signal applied to the data input of the additional D-type flip-flop has a first state that causes the additional D-type flip-flop to be clocked off the modulus output, and the first state occurs if modulus control changes before a given divide cycle is complete.

Example 18 includes the subject matter of any of Examples 15 through 17, wherein the additional D-type flip-flop resets the plurality of D-type flip-flops if an incorrect division occurs due to a power-of-2 boundary crossing.

Example 19 includes the subject matter of any of Examples 15 through 18, wherein the additional D-type flip-flop is part of a reset circuit that further includes a two-input multiplexer, the two-input multiplexer having an output coupled to a clock input of the additional D-type flip-flop, and a select/control coupled to an output of the additional D-type flip-flop, wherein a first input of the two-input multiplexer is coupled to the modulus output and the second input of the two-input multiplexer is coupled to the divided clock signal of a previous cell.

Example 20 includes the subject matter of Example 19, wherein the reset circuit further includes a two-input OR-gate having its first input coupled to the modulus output and its second output coupled to the output of the additional D-type flip-flop, and the modulus output is represented at an output of the OR-gate.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

What is claimed is:

1. A frequency divider circuit comprising:
a plurality of flip-flops operatively coupled to carry out division of an input frequency, the plurality of flip-flops configured to generate a modulus output and to receive a divided clock signal of a previous cell; and
an additional flip-flop that is selectively clocked off the modulus output or the divided clock of the previous stage, depending at least in part on a control signal applied to a data input of the additional flip-flop, wherein the additional flip-flop is configured to selectively reset the plurality of flip-flops to a state that will result in a correct divide ratio.

2. The circuit of claim 1 wherein the correct divide ratio is all zeros.

3. The circuit of claim 1 wherein the control signal applied to the data input of the additional flip-flop has a first state that causes the additional flip-flop to be clocked off the modulus output, and the first state occurs in response to modulus control changing before a given divide cycle is complete.

4. The circuit of claim 1 wherein the additional flip-flop resets the plurality of flip-flops in response to an incorrect division occurring due to a power-of-2 boundary crossing.

5. The circuit of claim 1 wherein the plurality of flip-flops is configured as a divide-by-2-or-3 cell.

6. The circuit of claim 1 wherein the plurality of flip-flops is configured as a divide-by-1-or-2-or-3 cell.

7. The circuit of claim 1 wherein the additional flip-flop is part of a reset circuit that further includes a multiplexer, the multiplexer having an output coupled to a clock input of the additional flip-flop, and a select/control coupled to an output of the additional flip-flop, wherein a first input of the multiplexer is coupled to the modulus output and a second input of the multiplexer is coupled to the divided clock signal of a previous cell.

8. The circuit of claim 7 wherein the reset circuit further includes a two-input OR-gate having its first input coupled to the modulus output and its second output coupled to the output of the additional flip-flop, and the modulus output is represented at an output of the OR-gate.

9. A frequency divider circuit comprising:
a plurality of D-type flip-flops operatively coupled as a divide-by-2-or-3 cell to carry out division of an input frequency, the plurality of D-type flip-flops configured to generate a modulus output and to receive a divided clock signal of a previous cell; and
an additional D-type flip-flop that is selectively clocked off the modulus output or the divided clock of the previous stage, depending at least in part on a control signal applied to a data input of the additional D-type flip-flop, wherein the additional D-type flip-flop is configured to selectively reset the plurality of D-type flip-flops to a state that will result in a correct divide ratio.

10. The circuit of claim 9 wherein the correct divide ratio is all zeros.

11. The circuit of claim 9 wherein the control signal applied to the data input of the additional D-type flip-flop has a first state that causes the additional D-type flip-flop to be clocked off the modulus output, and the first state occurs in response to modulus control changing before a given divide cycle is complete.

12. The circuit of claim 9 wherein the additional D-type flip-flop resets the plurality of D-type flip-flops in response to an incorrect division occurring due to a power-of-2 boundary crossing.

13. The circuit of claim 9 wherein the additional D-type flip-flop is part of a reset circuit that further includes a two-input multiplexer, the two-input multiplexer having an output coupled to a clock input of the additional D-type flip-flop, and a select/control coupled to an output of the additional D-type flip-flop, wherein a first input of the two-input multiplexer is coupled to the modulus output and the second input of the two-input multiplexer is coupled to the divided clock signal of a previous cell.

14. The circuit of claim 13 wherein the reset circuit further includes a two-input OR-gate having its first input coupled to the modulus output and its second output coupled to the output of the additional D-type flip-flop, and the modulus output is represented at an output of the OR-gate.

15. A frequency divider circuit comprising:
a plurality of D-type flip-flops operatively coupled as a divide-by-1-or-2-or-3 cell to carry out division of an input frequency, the plurality of D-type flip-flops configured to generate a modulus output and to receive a divided clock signal of a previous cell; and
an additional flip-flop that is selectively clocked off the modulus output or the divided clock of the previous stage, depending at least in part on a control signal applied to a data input of the additional flip-flop, wherein the additional flip-flop is configured to selectively reset the plurality of D-type flip-flops to a state that will result in a correct divide ratio.

16. The circuit of claim 15 wherein the correct divide ratio is all zeros.

17. The circuit of claim 15 wherein the control signal applied to the data input of the additional flip-flop has a first state that causes the additional flip-flop to be clocked off the modulus output, and the first state occurs in response to modulus control changing before a given divide cycle is complete.

18. The circuit of claim 15 wherein the additional flip-flop resets the plurality of D-type flip-flops in response to an incorrect division occurring due to a power-of-2 boundary crossing.

19. The circuit of claim 15 wherein the additional flip-flop is part of a reset circuit that further includes a two-input multiplexer, the two-input multiplexer having an output coupled to a clock input of the additional flip-flop, and a select/control coupled to an output of the additional flip-flop, wherein a first input of the two-input multiplexer is coupled to the modulus output and the second input of the two-input multiplexer is coupled to the divided clock signal of a previous cell.

20. The circuit of claim 19 wherein the reset circuit further includes a two-input OR-gate having its first input coupled to the modulus output and its second output coupled to the output of the additional flip-flop, and the modulus output is represented at an output of the OR-gate.

* * * * *